(12) United States Patent
Fu (10) Patent No.: US 9,192,073 B2
(45) Date of Patent: Nov. 17, 2015

(54) FIXING MECHANISM AND ELECTRONIC DEVICE THEREOF

(71) Applicant: Wistron Corporation, New Taipei (TW)

(72) Inventor: Zhao-Ping Fu, New Taipei (TW)

(73) Assignee: Wistron Corporation, Hsichih, New Taipei (TW)

(*) Notice: Subject to any disclaimer, the term of this patent is extended or adjusted under 35 U.S.C. 154(b) by 210 days.

(21) Appl. No.: 14/106,875

(22) Filed: Dec. 16, 2013

(65) Prior Publication Data

US 2014/0293568 A1 Oct. 2, 2014

(30) Foreign Application Priority Data

Mar. 28, 2013 (CN) ...................... 2013 2 0149246 U (51) Int. Cl.
*H05K 5/00* (2006.01)
*H05K 7/14* (2006.01)

(52) U.S. Cl.
CPC ........... *H05K 7/1409* (2013.01); *Y10T 403/595* (2015.01)

(58) Field of Classification Search
CPC .......................... H05K 7/1409; Y10T 403/595
USPC .................. 361/728, 732, 740, 747, 754, 759
See application file for complete search history.

(56) References Cited

U.S. PATENT DOCUMENTS

| | | | | |
|---|---|---|---|---|
| 5,973,934 A * | 10/1999 | Roscoe | ................ | H05K 7/1409 206/706 |
| 2005/0231923 A1* | 10/2005 | Peng | .................... | H05K 7/1409 361/754 |
| 2011/0297628 A1* | 12/2011 | Gong | ................... | H05K 7/1489 211/26 |
| 2012/0275849 A1 | 11/2012 | Fu | | |
| 2015/0195943 A1* | 7/2015 | Fricker | ................ | H05K 7/1409 361/679.58 |

* cited by examiner

*Primary Examiner* — Yuriy Semenenko
(74) *Attorney, Agent, or Firm* — Winston Hsu; Scott Margo (57) ABSTRACT

A fixing mechanism includes a base, a substrate and a latch. The base includes a constraining component and a contacting component. The substrate is slidably disposed on the base. The substrate includes a body, a fixing hole structure and a connecting portion. The base and the body respectively hold circuit boards. The fixing hole structure is disposed on the body for sheathing the constraining component. The fixing hole structure includes a first opening and a second opening, the second opening is connected to the first opening in a linearly stretching manner. The latch is rotatably disposed on the substrate. The latch includes a bar and a driving portion. The driving portion is disposed on an end of the bar and movably contacts against the contacting component. The driving portion slides relative to the contacting component with rotation of the bar to connect the connectors of the circuit boards.

16 Claims, 6 Drawing Sheets

FIXING MECHANISM AND ELECTRONIC DEVICE THEREOF

BACKGROUND OF THE INVENTION

1. Field of the Invention

The present invention relates to a fixing mechanism and an electronic device thereof, and more particularly, to a fixing mechanism with easy operational property and preferred assembly/disassembly convenience and an electronic device thereof.

2. Description of the Prior Art

In a conventional server host, the expand card is electrically connected to the built-in circuit board of the server host detachably for functional expansion and efficiency enhancement. Generally, the expand card is installed inside the casing of the server host by a fixing device for easy repair, and the fixing device can be a screw or a bolt. However, an auxiliary tool, such as the screw driver, is utilized to assemble and disassemble the conventional fixing device, which results in inconvenience. Thus, design of a tooless fixing device with easy operational property and preferred assembly/disassembly convenience is an important issue in the related mechanical design industry.

SUMMARY OF THE INVENTION

The present invention provides a fixing mechanism with easy operational property and preferred assembly/disassembly convenience and an electronic device thereof for solving above drawbacks.

According to the claimed invention, an fixing mechanism for assembling a first connector of a first circuit board with a second connector of a second circuit board is disclosed. The fixing mechanism includes a base, a substrate and at least one latch. The base is for supporting the second circuit board. The base includes a constraining component and a contacting component. The substrate is slidably disposed on the base. The substrate includes a body, a fixing hole structure and a connecting portion. The body is for supporting the first circuit board. The fixing hole structure is disposed on the body for sheathing the constraining component. A first opening and a second opening are formed on the fixing hole structure. The second opening is connected to the first opening in a linearly stretching manner. A dimension of the second opening is substantially smaller than a dimension of the first opening, and a dimension of the constraining component is between the dimensions of the first opening and the second opening. The connecting portion is disposed on the body. The latch is rotatably disposed on the substrate. The latch includes a bar and a driving portion. The bar pivots to the connecting portion. The driving portion is disposed on an end of the bar and movably contacting against the contacting component. The driving portion slides relative to the contacting component with rotation of the bar, so as to move the substrate relative to the base along a structural direction of the second opening.

According to the claimed invention, a rotary axis of the latch relative to the substrate is substantially perpendicular or parallel to a planar normal vector of the substrate.

According to the claimed invention, the first circuit board is locked on the body of the substrate by a fixing component.

According to the claimed invention, the substrate further includes a handle disposed on an edge of the body.

According to the claimed invention, the driving portion is a clamp structure. A side of the clamp structure presses the contacting component by rotation of the latch relative to the substrate along a first direction, so as to move the substrate close to a position of the base whereon the second circuit board is disposed. The other side of the clamp structure presses the contacting component by the rotation of the latch relative to the substrate along a second direction opposite to the first direction, so as to move the substrate away from the position of the base.

According to the claimed invention, the driving portion is a dentate structure, the contacting component is a cone pillar, and the cone pillar is substantially engaged with the dentate structure.

According to the claimed invention, the latch further includes a first engaging portion disposed on the other end of the bar opposite to the driving portion. The substrate further includes a second engaging portion, and the first engaging portion is for engaging with the second engaging portion.

According to the claimed invention, the first engaging portion is a folded structure, and the second engaging portion is an aperture structure. Two outer ends of the folded structure are respectively connected to the bar and being a free end. A middle end of the folded structure between the outer ends is for engaging with the aperture structure.

According to the claimed invention, the first engaging portion is made of resilient material.

According to the claimed invention, the first circuit board includes a pierce hole structure aligning with the second opening on the fixing hole structure. The base further includes a reference component. The pierce hole structure aligns with the reference component when the first connector is assembled with the second connector.

According to the claimed invention, an electronic device includes a first circuit board, a second circuit board and a fixing mechanism. The first circuit board and the second circuit board respectively include a first connector and a second connector. The fixing mechanism is for assembling the first connector with the second connector. The fixing mechanism includes a base, a substrate and at least one latch. The base is for supporting the second circuit board. The base includes a constraining component and a contacting component. The substrate is slidably disposed on the base. The substrate includes a body, a fixing hole structure and a connecting portion. The body is for supporting the first circuit board. The fixing hole structure is disposed on the body for sheathing the constraining component. A first opening and a second opening are formed on the fixing hole structure. The second opening is connected to the first opening in a linearly stretching manner. A dimension of the second opening is substantially smaller than a dimension of the first opening, and a dimension of the constraining component is between the dimensions of the first opening and the second opening. The connecting portion is disposed on the body. The latch is rotatably disposed on the substrate. The latch includes a bar and a driving portion. The bar pivots to the connecting portion. The driving portion is disposed on an end of the bar and movably contacting against the contacting component. The driving portion slides relative to the contacting component with rotation of the bar, so as to move the substrate relative to the base along a structural direction of the second opening.

The fixing mechanism of the present invention can be manually operated to rapidly assemble and disassemble the expand card (the first circuit board) without an auxiliary extra tool. The latch of the fixing mechanism moves the substrate relative to the base by leverage theory for easy assembly and disassembly. Thus, the present invention provides the fixing mechanism with easy operational property and preferred assembly/disassembly convenience and the electronic device thereof.

DETAILED DESCRIPTION

Figure 1:
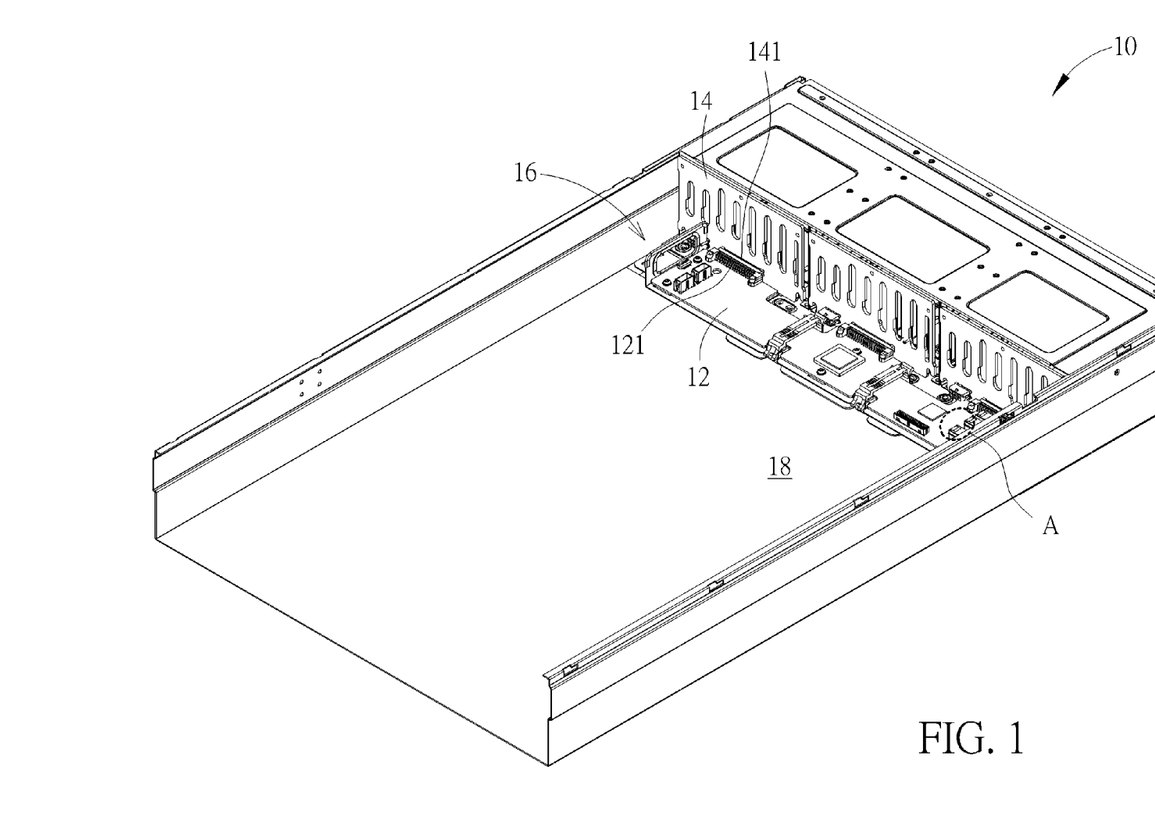
FIG. 1 is a diagram of an electronic device according to an embodiment of the present invention.
Figure 2:
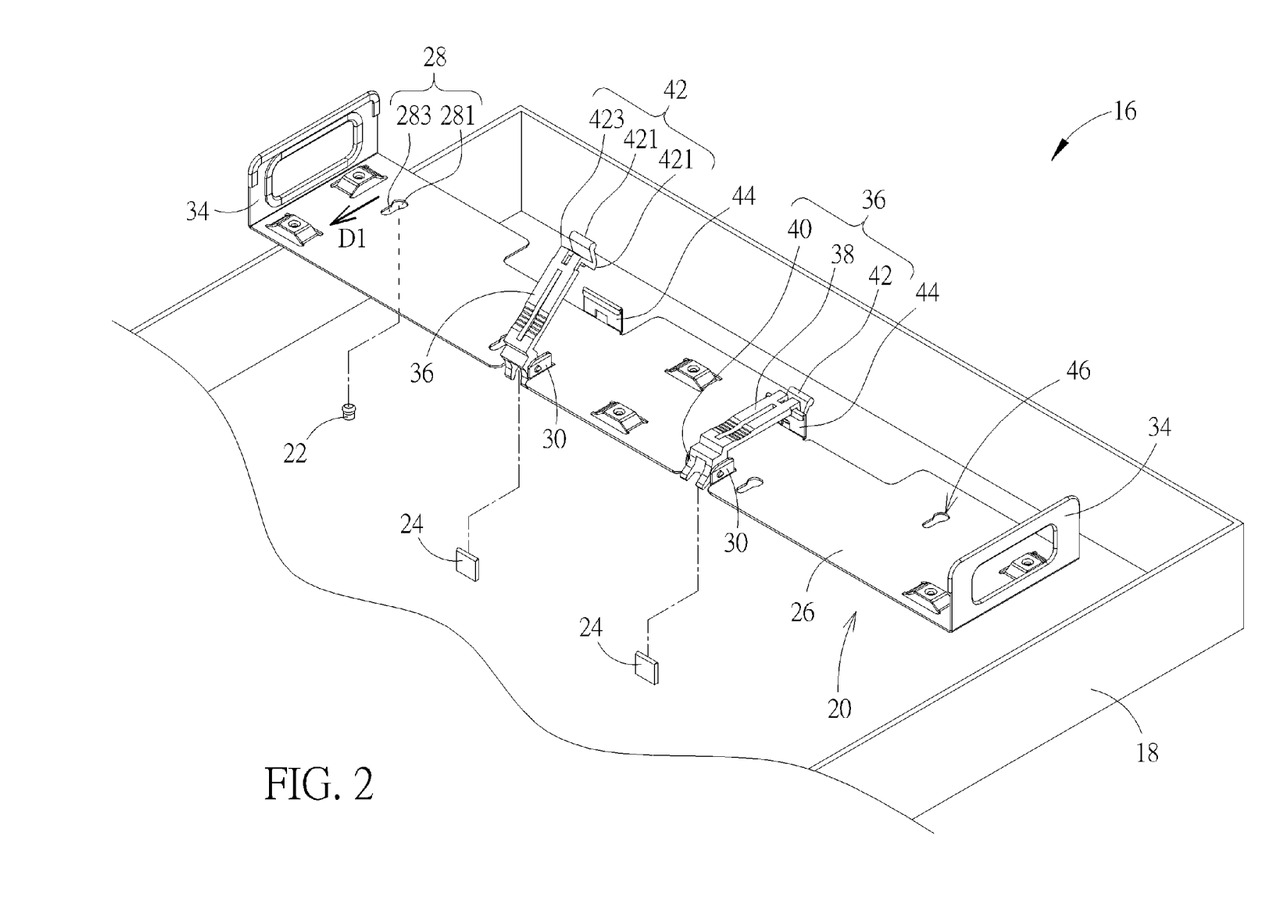
FIG. 2 is a diagram of a fixing mechanism according to the embodiment of the present invention.

Please refer to FIG. 1. FIG. 1 is a diagram of an electronic device 10 according to an embodiment of the present invention. The electronic device 10 includes a first circuit board 12, a second circuit board 14 and a fixing mechanism 16. The first circuit board 12 and the second circuit board 14 respectively include a first connector 121 and a second connector 141. Please refer to FIG. 2. FIG. 2 is a diagram of the fixing mechanism 16 according to the embodiment of the present invention. The fixing mechanism 16 includes a base 18 and a substrate 20. The base 18 is for supporting the second circuit board 14, and the substrate 20 is for supporting the first circuit board 12. The substrate 20 is slidably disposed on the base 18. The fixing mechanism 16 can assemble the first connector 121 with the second connector 141 for transmitting an electronic signal between the circuit boards.

Figure 3:
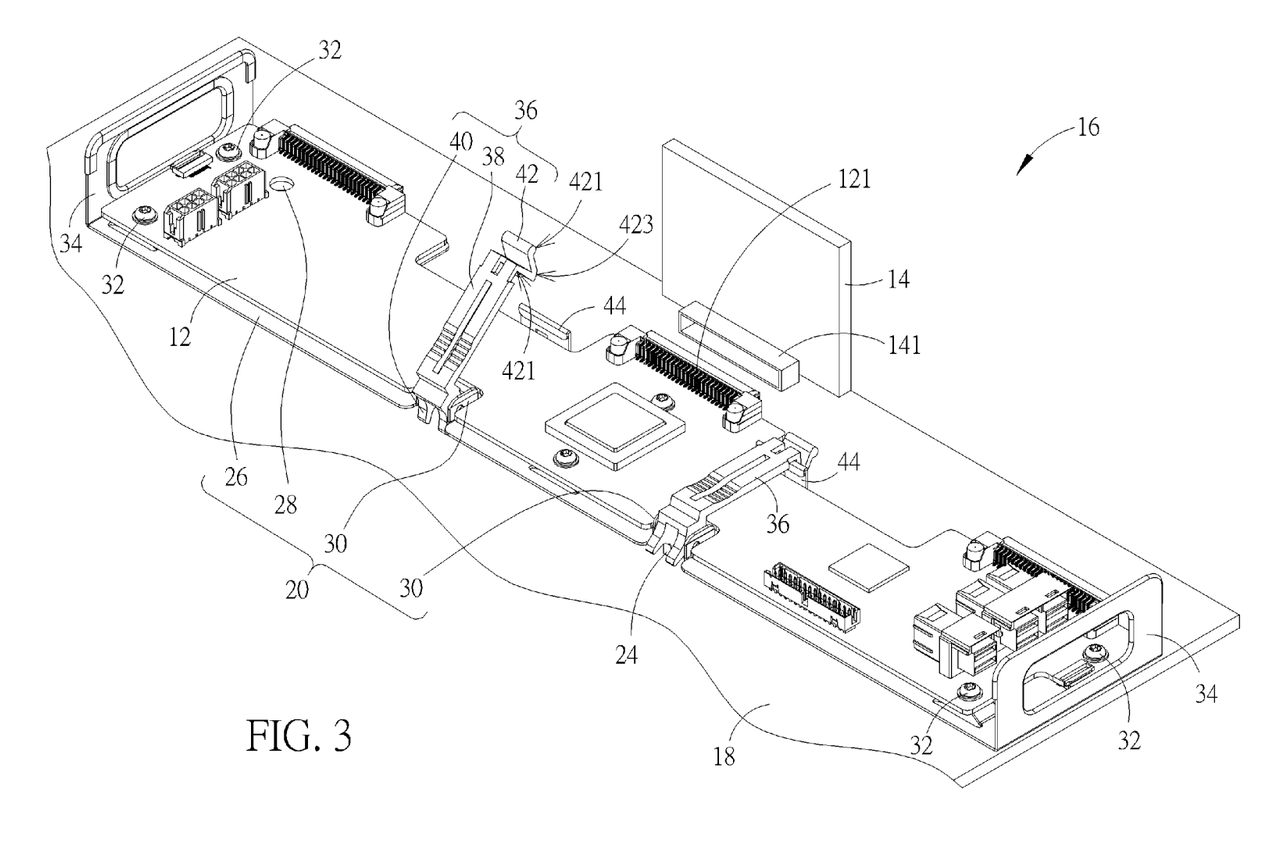
FIG. 3 is a diagram of the fixing mechanism and the circuit boards according to the embodiment of the present invention.

Please refer to FIG. 2 and FIG. 3. FIG. 3 is a diagram of the fixing mechanism 16 and the circuit boards according to the embodiment of the present invention. As shown in FIG. 2 and FIG. 3, the base 18 includes a constraining component 22 and a plurality of contacting components 24. For example, the constraining component 22 can be a protrusion disposed on a surface of the base 18, and the contacting component 24 can be a perpendicularly stretching wall formed on the surface of the base 18. The substrate 20 includes a body 26, a fixing hole structure 28 and a plurality of connecting portions 30. The first circuit board 12 can be locked on the body 26 by an external fixing component. The fixing hole structure 28 is disposed on the body 26 for sheathing the constraining component 22. The fixing mechanism 16 can include a plurality of constraining components 22 and a plurality of fixing hole structures 28 for balancing slidable stability of the substrate 20 relative to the base 18. An amount of combinations of the constraining component 22 and the fixing hole structure 28 depends on design demand, and a detailed description is omitted herein for simplicity. The substrate 20 can further include a handle 34 disposed on an edge of the body 26. The user can utilize the handle 34 to manually put the substrate 20 on the base 18 or to lift the substrate 20 from the base 18.

A first opening 281 and a second opening 283 can be formed on the fixing hole structure 28. A dimension of the second opening 283 is substantially smaller than a dimension of the first opening 281, and the second opening 283 is connected to the first opening 281 in a linearly stretching manner. The constraining component 22 can be an umbrella-shaped pillar, and dimension of a top portion of the umbrella-shaped pillar is between the dimensions of the first opening 281 and the second opening 283. The constraining component 22 can insert into the first opening 281, and then slide along a structural direction D1 of the second opening 283 to prevent the base 18 and the substrate 20 from separation. In addition, the connecting portion 30 is disposed on the body 26. An amount of the connecting portion 30 corresponds to an amount of the contacting component 24. When the substrate 20 is slidably disposed on the base 18 by the combination of the constraining component 22 and the fixing hole structure 28, each connecting portion 30 is located above the corresponding contacting component 24, so that the latch 36 of the fixing mechanism 16 can pivot to the connecting portion 30 and press around the contacting component 24 at the same time.

The fixing mechanism 16 can include a plurality of latches 36, and an amount of the latch 36 corresponds to amounts of the contacting component 24 and the connecting portion 30. The latch 36 includes a bar 38 and a driving portion 40. The bar 38 has a protruding pivot shaft, and is rotatably disposed on the connecting portion 30. Each connecting portion 30 includes two opposite plank structures. An upper edge of the plank structure has an inclined surface for guiding the bar 38 to dispose on the connecting portion 30 conveniently. The driving portion 40 is disposed on an end of the bar 38 and movably contacts against the contacting component 24. When the latch 36 rotates relative to the connecting portion 30, the driving portion 40 can rotate relative to the contacting component 24 to generate the reacting force, so as to move the substrate 20 relative to the base 18 along the structural direction D1 of the second opening 283 for assembly and disassembly of the first connector 121 and the second connector 141.

The latch 36 can further include a first engaging portion 42 disposed on the other end of the bar 38 opposite to the driving portion 40. The substrate 20 can further include a second engaging portion 44 disposed on a position of the body 26 opposite to the connecting portion 30. The first engaging portion 42 can be a folded structure made of resilient material, and the second engaging portion 44 can be an aperture structure. The V-shaped folded structure (the first engaging portion 42) includes two outer ends 421 and a middle end 423 located between the outer ends 421. The two outer ends 421 are respectively connected to the bar 38 and being a free end. The middle end 23 can be engaged with the aperture structure (the second engaging portion 44) in a resiliently deformable manner. The latch 36 pivots to the connecting portion 30, and utilizes the reacting force, which is generated when the latch 36 presses the contacting component 24, to move the substrate 20 relative to the base 18. And the latch 36 stops rotation when the first engaging portion 42 is engaged with the second engaging portion 44. Further, the free end (one of the outer ends 421) of the first engaging portion 42 can be pressed to generate the resilient deformation for separating the first engaging portion 42 from the second engaging portion 44.

Figure 4:
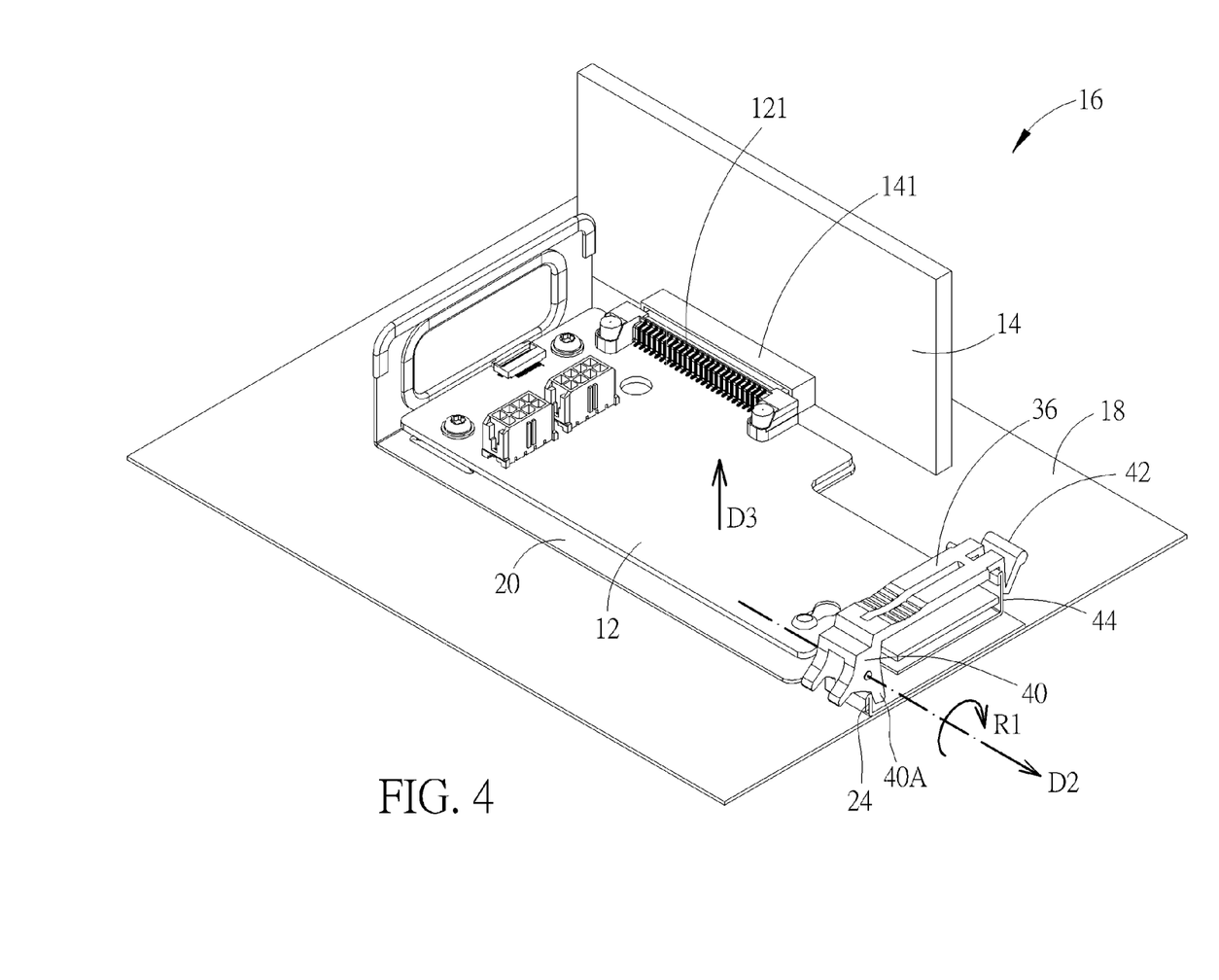
FIG. 4 and FIG. 5 respectively are diagrams of the fixing mechanism in different operating procedures according to the embodiment of the present invention.
Figure 5:
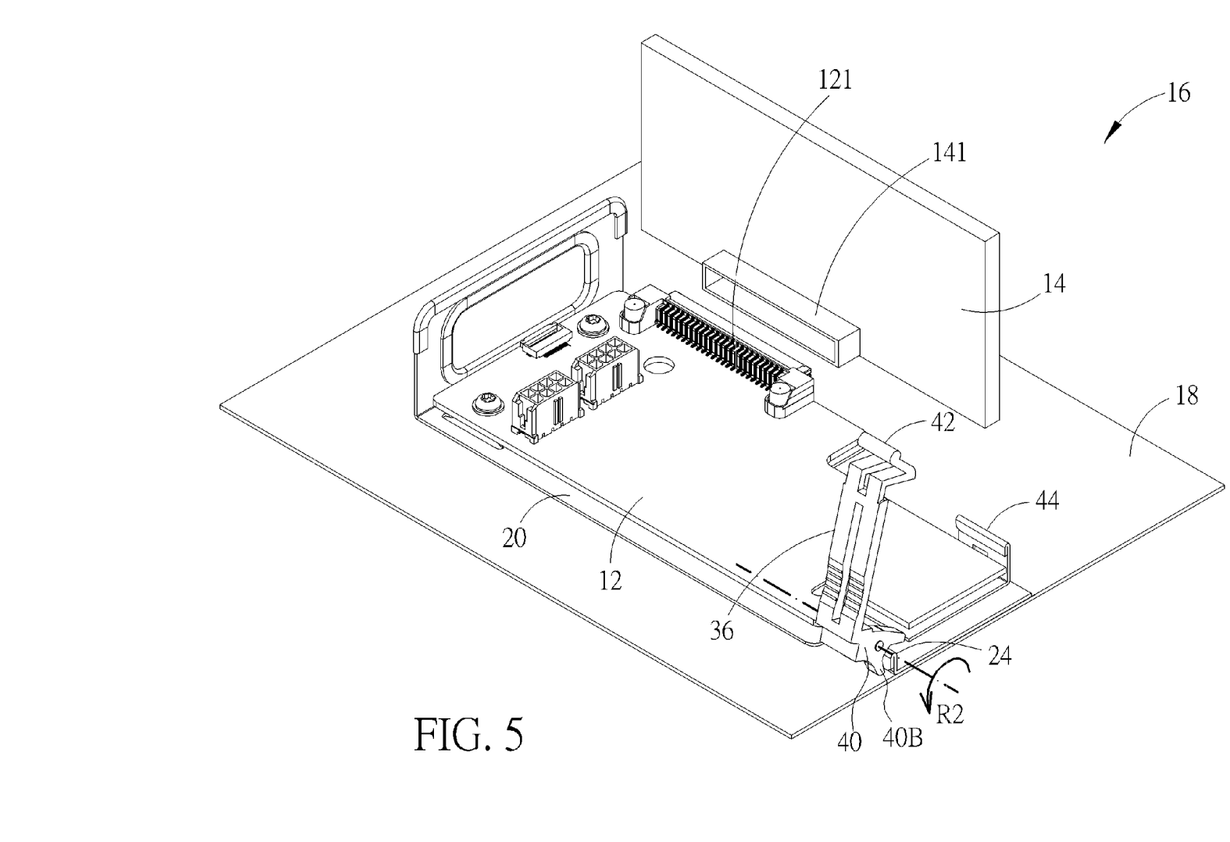

Please refer to FIG. 4 and FIG. 5. FIG. 4 and FIG. 5 respectively are diagrams of the fixing mechanism 16 in different operating procedures according to the embodiment of the present invention. The driving portion 40 can be a clamp structure, which means the driving portion 40 has two opposite protruding sides 40A and 40B. As shown in FIG. 4, when the latch 36 rotates relative to the substrate 20 along a first direction R1, the protruding side 40A of the clamp structure presses a right surface of the contacting component 24, so as to move the substrate 20 close to a position of the base 18 whereon the second circuit board 14 is disposed for assembling the first connector 121 with the second connector 141.

As shown in FIG. 5, when the latch 36 rotates relative to the substrate 20 along a second direction R2 opposite to the first direction R1, the protruding side 40B of the clamp structure presses a left surface of the contacting component 24 to move the substrate 20 away from the position of the base 18 for disassembling the first connector 121 from the second connector 141 easily and rapidly.

It is to say, the driving portion 40 can be a dentate structure, and the contacting component 24 can be a cone pillar. The cone pillar is substantially engaged with the dentate structure. When the latch 36 rotates relative to the substrate 20, the driving portion 40 can move relative to the contacting component 24 for shifting. Because the latch 36 pivots to the substrate 20 and the substrate 20 is slidably disposed on the base 18, a relative movement between the driving portion 40 and the contacting component 24 can move the substrate 20 relative to the base 18, so as to rapidly assemble and disassemble the first circuit board 12 from the second circuit board 14. It should be mentioned that an interval between two ends of the dentate structure and a structural width of the cone pillar are substantially proportional to a slide stroke of the substrate 20 relative to the base 18, and the slide stroke is limited to a structural length of the second opening 283. Parameters of the above-mentioned elements depend on actual demand, and the detailed description is omitted herein for simplicity.

Figure 6:
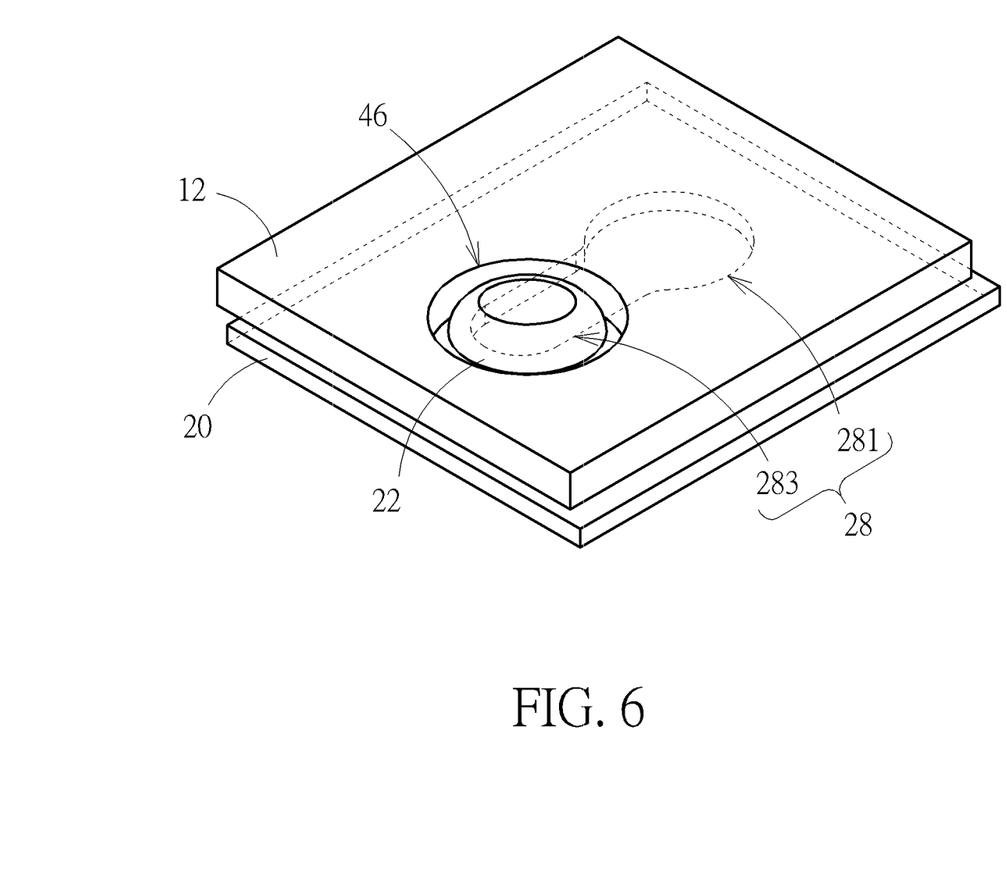
FIG. 6 is a diagram of an area of the electronic device in the other view according to the embodiment of the present invention.

Please refer to FIG. 2 and FIG. 6. FIG. 6 is a diagram of an area A of the electronic device 10 in the other view according to the embodiment of the present invention. The first circuit board 12 can include a pierce hole structure 46. When the first circuit board 12 is disposed on the substrate 20, the pierce hole structure 46 aligns with the second opening 283 on the fixing hole structure 28. The base 18 further includes a reference component, which can be the constraining component 22. A position of the pierce hole structure 46 disposed on the first circuit board 12 is that the pierce hole structure 46 can align with the reference component when the first connector 121 is assembled with the second connector 141. Therefore, the user can determine whether the first connector 121 is accurately assembled with the second connector 141 by watching relative alignment between the pierce hole structure 46 and the reference component (the constraining component 22).

In the embodiment, a rotary axis D2 of the latch 36 relative to the substrate 20 is substantially perpendicular to a planar normal vector D3 of the substrate 20, as shown in FIG. 4. The latch 36 can be rotated upwardly and downwardly to drive the assembly and the disassembly of the first connector 121 and the second connector 141 by the fixing mechanism 16. Besides, the latch 36 can be put on the substrate 20 laterally, which means the rotary axis D2 of the latch 36 relative to the substrate 20 is substantially parallel to the planar normal vector D3 of the substrate 20 for providing the other embodiment that the latch 36 can be rotated horizontally. However, application of the latch 36 is not limited to the above-mentioned embodiments, the latch capable of moving the substrate relative to the base belongs to scope of the present invention.

In conclusion, the present invention utilizes the substrate for supporting the first circuit board, the base for supporting the second circuit board and the latch pivoting to the substrate to be the fixing mechanism. The base can be a supporter disposed inside a casing of the electronic device, the substrate can be a metal frame, and the latch can be a resilient plastic element. The substrate utilizes the fixing hole structure to engage with the constraining component of the base, so that the substrate can move relative to the base along the single direction (the structural direction of the second opening on the fixing hole structure). The driving portion of the latch movably contacts against the contacting component of the base, and the contacting component contacts against an end of an inner wall of the driving portion. When the latch pivots to the substrate, the driving portion presses the contacting component and surrounds from a surface of the contacting component to the other surface of the contacting component. Because a rotary center of the driving portion relative to the contacting component has the property of structural dislocation, the driving portion can move linearly when surrounding the contacting component, so as to slide the substrate relative to the base for assembling and disassembling the first connector from the second connector.

Comparing to the prior art, the fixing mechanism of the present invention can be manually operated to rapidly assemble and disassemble the expand card (the first circuit board) without an auxiliary extra tool. The latch of the fixing mechanism moves the substrate relative to the base by leverage theory for easy assembly and disassembly. Thus, the present invention provides the fixing mechanism with easy operational property and preferred assembly/disassembly convenience and the electronic device thereof.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A fixing mechanism for assembling a first connector of a first circuit board with a second connector of a second circuit board, the fixing mechanism comprising:
   a base for supporting the second circuit board, the base comprising a constraining component and a contacting component;
   a substrate slidably disposed on the base, the substrate comprising:
      a body for supporting the first circuit board;
      a fixing hole structure disposed on the body for sheathing the constraining component, a first opening and a second opening being formed on the fixing hole structure, the second opening being connected to the first opening in a linearly stretching manner, a dimension of the second opening being substantially smaller than a dimension of the first opening, and a dimension of the constraining component being between the dimensions of the first opening and the second opening;
      a connecting portion disposed on the body; and
   at least one latch rotatably disposed on the substrate, the latch comprising:
      a bar pivoting to the connecting portion; and
      a driving portion disposed on an end of the bar and movably contacting against the contacting component, the driving portion sliding relative to the contacting component with rotation of the bar, so as to move the substrate relative to the base along a structural direction of the second opening.

2. The fixing mechanism of claim 1, wherein a rotary axis of the latch relative to the substrate is substantially perpendicular or parallel to a planar normal vector of the substrate.

3. The fixing mechanism of claim 1, wherein the driving portion is a clamp structure, a side of the clamp structure presses the contacting component by rotation of the latch relative to the substrate along a first direction so as to move the substrate close to a position of the base whereon the second circuit board is disposed, the other side of the clamp structure presses the contacting component by the rotation of the latch relative to the substrate along a second direction opposite to the first direction so as to move the substrate away from the position of the base.

4. The fixing mechanism of claim 1, wherein the driving portion is a dentate structure, the contacting component is a cone pillar, and the cone pillar is substantially engaged with the dentate structure.

5. The fixing mechanism of claim 1, wherein the latch further comprises a first engaging portion disposed on the other end of the bar opposite to the driving portion, the substrate further comprises a second engaging portion, and the first engaging portion is for engaging with the second engaging portion.

6. The fixing mechanism of claim 5, wherein the first engaging portion is a folded structure, the second engaging portion is an aperture structure, two outer ends of the folded structure are respectively connected to the bar and being a free end, a middle end of the folded structure between the outer ends is for engaging with the aperture structure.

7. The fixing mechanism of claim 5, wherein the first engaging portion is made of resilient material.

8. The fixing mechanism of claim 1, wherein the first circuit board comprises a pierce hole structure aligning with the second opening on the fixing hole structure, the base further comprises a reference component, the pierce hole structure aligns with the reference component when the first connector is assembled with the second connector.

9. An electronic device comprising:
a first circuit board, the first circuit board comprising a first connector;
a second circuit board, the second circuit board comprising a second connector; and
a fixing mechanism for assembling the first connector with the second connector, the fixing mechanism comprising:
a base for supporting the second circuit board, the base comprising a constraining component and a contacting component;
a substrate slidably disposed on the base, the substrate comprising:
a body for supporting the first circuit board;
a fixing hole structure disposed on the body for sheathing the constraining component, a first opening and a second opening being formed on the fixing hole structure, the second opening being connected to the first opening in a linearly stretching manner, a dimension of the second opening being substantially smaller than a dimension of the first opening, and a dimension of the constraining component being between the dimensions of the first opening and the second opening;
a connecting portion disposed on the body; and
at least one latch rotatably disposed on the substrate, the latch comprising:
a bar pivoting to the connecting portion; and
a driving portion disposed on an end of the bar and movably contacting against the contacting component, the driving portion sliding relative to the contacting component with rotation of the bar, so as to move the substrate relative to the base along a structural direction of the second opening.

10. The electronic device of claim 9, wherein a rotary axis of the latch relative to the substrate is substantially perpendicular or parallel to a planar normal vector of the substrate.

11. The electronic device of claim 9, wherein the driving portion is a clamp structure, a side of the clamp structure presses the contacting component by rotation of the latch relative to the substrate along a first direction so as to move the substrate close to the base for assembling the first connector with the second connector, the other side of the clamp structure presses the contacting component by the rotation of the latch relative to the substrate along a second direction opposite to the first direction so as to move the substrate away from the base for disassembling the first connector from the second connector.

12. The electronic device of claim 9, wherein the driving portion is a dentate structure, the contacting component is a cone pillar, and the cone pillar is substantially engaged with the dentate structure.

13. The electronic device of claim 9, wherein the latch further comprises a first engaging portion disposed on the other end of the bar opposite to the driving portion, the substrate further comprises a second engaging portion, and the first engaging portion is for engaging with the second engaging portion.

14. The electronic device of claim 13, wherein the first engaging portion is a folded structure, the second engaging portion is an aperture structure, two outer ends of the folded structure are respectively connected to the bar and being a free end, a middle end of the folded structure between the outer ends is for engaging with the aperture structure.

15. The electronic device of claim 13, wherein the first engaging portion is made of resilient material.

16. The electronic device of claim 9, wherein the first circuit board comprises a pierce hole structure aligning with the second opening on the fixing hole structure, the base further comprises a reference component, the pierce hole structure aligns with the reference component when the first connector is assembled with the second connector.

* * * * *